United States Patent [19]
Guo et al.

[11] Patent Number: 5,703,485
[45] Date of Patent: Dec. 30, 1997

[54] METHOD AND TEST STRUCTURE FOR DETERMINING MAGNETIC DOMAIN SWITCHING FIELD WHEN FABRICATING PATTERNED EXCHANGE BIASED MAGNETORESISTIVE (MR) HEAD

[75] Inventors: Yimin Guo, Sunnyvale; Kochan Ju, San Jose; Yimin Hsu, Sunnyvale, all of Calif.

[73] Assignee: Headway Technologies, Inc., Milpitas, Calif.

[21] Appl. No.: 687,903

[22] Filed: Jul. 29, 1996

[51] Int. Cl.$^6$ .......................... G01R 33/02; H01F 10/02; H01L 43/00
[52] U.S. Cl. .................. 324/235; 324/252; 338/32 R; 427/130
[58] Field of Search ...................... 324/235, 252, 324/765, 766; 338/32 R; 360/113; 427/130, 131, 132; 257/921, 424

[56] References Cited

U.S. PATENT DOCUMENTS

| | | | |
|---|---|---|---|
| 4,800,457 | 1/1989 | Kryder et al. | 360/113 |
| 5,309,305 | 5/1994 | Nepela et al. | 360/113 |
| 5,380,548 | 1/1995 | Lin et al. | 427/130 |

OTHER PUBLICATIONS

R.E. Fontana, Jr. "Process Complexity of Magnetoresistive Sensors: A Review" IEEE Trans on Magnetics, vol. 31(6) Nov. 1995, pp. 2579–84.
C. Tsang et al. "Temperature dependence of unidirectional anisotropy effects in the Permalloy–FeMn systems" J. Appl Phys, vol. 53(3) Mar. 1982, pp. 2605–07.
C. Tsang, "Unshielded MR Elements With Patterned Exchange Biasing" IEEE Trans on Magnetics, vol. 25(5), Sept. 1989, pp. 3692–94.
T Lin et al. "Exchange–Coupled Ni–Fe/Ni–Mn and NiO/Ni–Fe Films for Stabilization of Magnetoresistive Sensors," IEEE Trans on Magnetics, vol. 31(6), Nov. 1995, pp. 2585–90.

Primary Examiner—Walter E. Snow
Attorney, Agent, or Firm—George O. Saile; Stephen B. Ackerman; Alek P. Szecsy

[57] ABSTRACT

A method for determining through a test structure a longitudinal magnetic exchange field within a patterned exchange biased magnetoresistive (MR) sensor element. To practice the method, there is first provided a substrate. Formed upon the substrate is a patterned magnetoresistive (MR) layer which has a projected length upon the substrate and a projected width upon the substrate. There is formed at a pair of separated locations over the patterned magnetoresistive (MR) layer a pair of patterned conductor lead layers. The pair of patterned conductor lead layers is separated by a track width of the patterned magnetoresistive (MR) layer, where the track width is smaller than the projected width. There is also formed within the track width and upon the patterned magnetoresistive (MR) layer a minimum of one patterned anti-ferromagnetic layer separated from each patterned conductor lead layer within the pair of patterned conductor lead layers by a minimum of one unpinned width of the patterned magnetoresistive (MR) layer. The patterned magnetoresistive (MR) layer also has a minimum of one pinned width of the patterned magnetoresistive (MR) layer beneath the minimum of one patterned anti-ferromagnetic layer. The projected length, the unpinned width and the pinned width of the patterned magnetoresistive (MR) layer are chosen such that the magnetic domains within the unpinned width and the pinned width are coupled such that they switch jointly in an externally applied magnetic field. Finally, there is measured through the patterned conductor lead layers a resistance change within the patterned magnetoresistive (MR) layer when the patterned magnetoresistive (MR) layer is exposed to the externally applied magnetic field. The invention also contemplates the test structure through which the method of the invention is practiced.

20 Claims, 5 Drawing Sheets

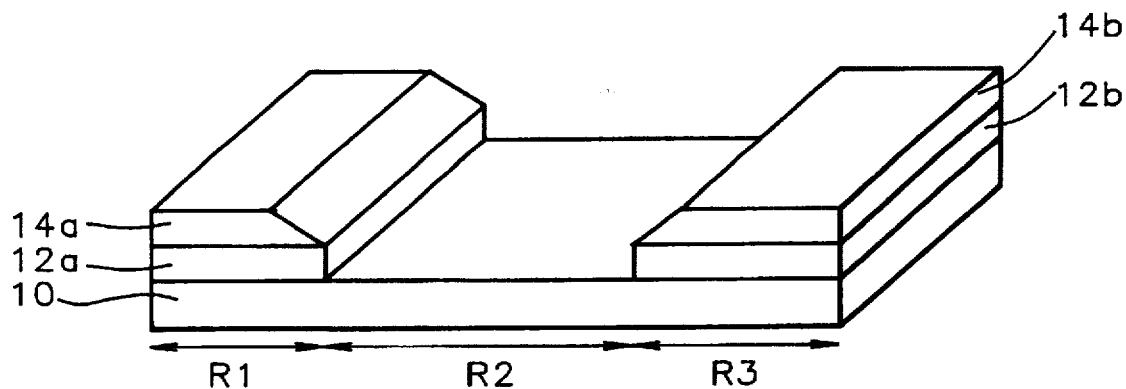
*FIG. 1 - Prior Art*
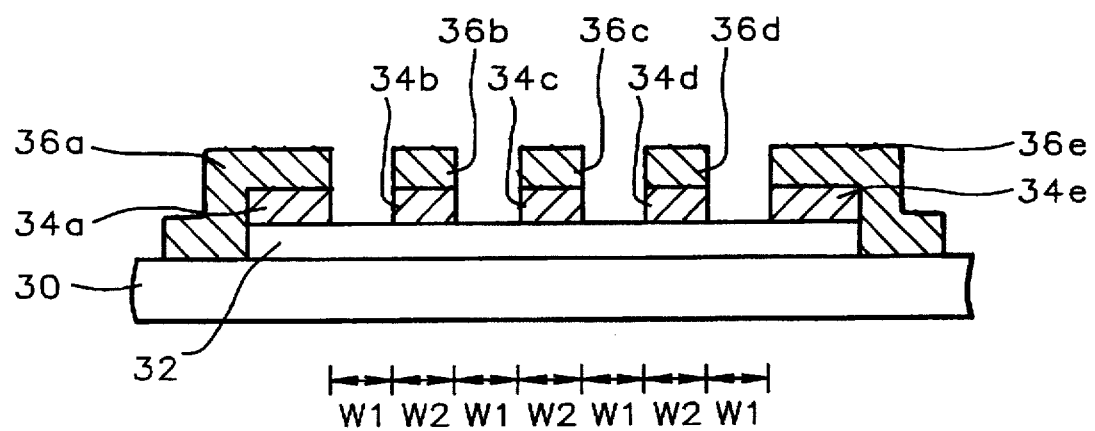
*FIG. 2*

METHOD AND TEST STRUCTURE FOR DETERMINING MAGNETIC DOMAIN SWITCHING FIELD WHEN FABRICATING PATTERNED EXCHANGE BIASED MAGNETORESISTIVE (MR) HEAD

BACKGROUND OF THE INVENTION

1. Field of the Invention

The present invention relates generally to magnetoresistive (MR) sensor elements employed in fabricating magnetoresistive (MR) read-write heads. More particularly, the present invention relates to a test structure employed in determining a longitudinal magnetic exchange field when fabricating a patterned exchange biased magnetoresistive (MR) sensor element employed in a magnetoresistive (MR) read-write head.

2. Description of the Related Art

The recent and continuing advances in computer and information technology have been made possible not only by the correlating advances in the functionality, reliability and speed of semiconductor integrated circuits, but also by the correlating advances in storage density of direct access storage devices (DASDs) employed in advanced magnetic data storage and retrieval.

Within advanced magnetic data storage and retrieval through direct access storage devices (DASDs), as well as through other advanced magnetic data storage and retrieval devices, there has been proposed and implemented the use of magnetoresistive (MR) sensor elements as a means for retrieving digitally encoded magnetic data. Magnetoresistive (MR) sensor elements are desirable in comparison with other magnetic data retrieval sensor elements for retrieving digitally encoded magnetic data since they are inherently capable of providing high output digital signals, with good linear resolution, independent of the relative velocity of a magnetic data storage medium with respect to the magnetoresistive (MR) sensor element. For a general description of the various types and methods for fabricating of magnetoresistive (MR) sensor elements within magnetoresistive read-write heads see, for example, R. E. Fontana, Jr., "Process Complexity of Magnetoresistive Sensors: A Review," IEEE Trans. on Magnetics, Vol. 31 (6), November 1995, pp. 2579–84.

Within the general category of magnetoresistive (MR) sensor elements, as fabricated within magnetoresistive (MR) read-write heads for retrieving digitally encoded magnetic data, there exists the patterned exchange biased magnetoresistive (MR) sensor element. As illustrated within FIG. 1, the patterned exchanged biased magnetoresistive (MR) sensor element is formed by patterning upon the tail regions of a magnetoresistive (MR) layer 10 a pair of patterned anti-ferromagnetic layers 12a and 12b. As is illustrated within FIG. 1, the pair of patterned anti-ferromagnetic layers 12a and 12b is typically, although not exclusively, formed beneath a corresponding pair of patterned conductor lead layers 14a and 14b through which the resistance of the magnetoresistive (MR) layer 10 is measured. Within FIG. 1, R1 and R3 are the electrical lead regions of the magnetoresistive (MR) layer 10 and R2 is the sensing region of the magnetoresistive (MR) layer 10. The sensing region R2 has a track width defined by the separation distance of the patterned anti-ferromagnetic layers 12a and 12b.

Within patterned exchange biased magnetoresistive (MR) sensor elements of the type illustrated within FIG. 1, the patterned anti-ferromagnetic layers 12a and 12b provide, through magnetic coupling to the electrical lead regions R1 and R3 of the magnetoresistive (MR) layer 10, a longitudinal magnetic exchange field which magnetically aligns the magnetic domains of the magnetoresistive (MR) layer 10 within the electrical lead regions R1 and R3. In addition, the patterned anti-ferromagnetic layers 12a and 12b preferably also provide a longitudinal magnetic exchange field of sufficient magnitude to the sensing region R2 of the magnetoresistive (MR) layer 10 such that the sensing region R2 of the magnetoresistive (MR) layer 10 is aligned into a single magnetic domain. Through alignment of the sensing region R2 of the magnetoresistive (MR) layer 10 into a single magnetic domain, there is provided a magnetoresistive (MR) sensor element with substantially noise free (ie: Barkhausen noise free) operation.

Further descriptions of various exchange biased magnetoresistive (MR) sensor element fabrications, as well as the physical characteristics of those exchange biased magnetoresistive (MR) sensor element fabrications, may be found in several disclosures within the art, including but not limited to: (1) C. Tsang et al., "Temperature dependence of unidirectional anisotropy effects in the Permalloy-FeMn systems," J. Appl. Phys., Vol. 53(3), March 1982, pp. 2605–07; (2) C. Tsang, "Unshielded MR Elements With Patterned Exchange Biasing," IEEE Trans. on Magnetics, Vol. 25(5), September 1989, pp. 3692–94; and (3) T. Lin et al., "Exchange-Coupled Ni-Fe/Fe-Mn, Ni-Fe/Ni-Mn and NiO/Ni-Fe Films for Stabilization of Magnetoresistive Sensors," IEEE Trans. on Magnetics, Vol. 31(6), November 1995, pp. 2585–90.

As is understood in the art, the strength of the longitudinal magnetic exchange field formed within a patterned exchange biased magnetoresistive (MR) sensor element, such as the patterned exchange biased magnetoresistive (MR) sensor element whose schematic perspective-view diagram is illustrated within FIG. 1, is particularly dependent upon the characteristics of the interface between a pair of patterned anti-ferromagnetic layers, such as the pair of patterned anti-ferromagnetic layers 12a and 12b, and a magnetoresistive (MR) layer, such as the magnetoresistive (MR) layer 10. It is thus of significant importance within the fabrication of patterned exchange biased magnetoresistive (MR) sensor elements to provide a method for determining the magnitude of the longitudinal magnetic exchange field which provides the longitudinal magnetic biasing to the sensing region of a magnetoresistive (MR) layer from which is formed a magnetoresistive (MR) sensor element. It is towards that goal that the present invention is generally directed.

While the determination of longitudinal magnetic exchange fields within patterned exchange biased magnetoresistive (MR) sensor elements may theoretically be readily provided through analysis of magnetic flux (B) versus magnetic field (H) measurements of patterned exchange biased magnetoresistive (MR) sensor elements, such magnetic flux (B) versus magnetic field (H) measurements may not typically be practically obtained for an individual magnetoresistive (MR) sensor element, since there is typically provided a substantial multiplicity of magnetoresistive (MR) sensor elements formed upon a single substrate when forming through photolithographic methods as are typically employed in the art magnetoresistive (MR) sensor elements for use within magnetoresistive (MR) read-write heads. Thus, it is desirable to provide a more practical method for determining the longitudinal magnetic exchange field within a patterned exchange biased magnetoresistive (MR) sensor element, where the method may employ a more practical measurement of the magnetoresistive (MR) sensor element, such as, for example, a resistance (R) versus magnetic field (H) measurement of the magnetoresistive (MR) sensor element. Unfortunately, while resistance (R) versus magnetic field (H) measurements of magnetoresistive (MR) sensor elements are conceptually desirable and easily obtainable, they are inherently subject to noise induced inaccuracies when the sensing region of a magnetoresistive (MR) sensor element is not completely aligned into a single magnetic domain. Such incomplete magnetic domain alignment may occur, for example, within a patterned exchange biased magnetoresistive (MR) sensor element of increased length. It is therefore desirable in the art to provide a method through which a longitudinal magnetic exchange field may be accurately determined from a resistance (R) versus magnetic field (H) measurement of a test structure formed simultaneously with but independent of the geometry of a patterned exchange biased magnetoresistive (MR) sensor element. It is towards that goal that the present invention is specifically directed.

Various magnetoresistive (MR) sensor elements and/or magnetoresistive (MR) read-write heads exhibiting novel characteristics or properties have been disclosed in the art. For example, Kryder et al. in U.S. Pat. No. 4,800,457 discloses an exchange biased magnetoresistive (MR) sensor element employing a rare earth transition metal anti-ferromagnetic exchange biasing layer. The rare earth transition metal anti-ferromagnetic exchange biasing layer provides a stronger and more temperature independent longitudinal magnetic exchange field within the magnetoresistive (MR) sensor element. In addition, Nepela et al. in U.S. Pat. No. 5,309,305 disclose a dual element magnetoresistive sensing head employing dual magnetoresistive (MR) layers with dual anti-ferromagnetic layers formed thereupon to provide anti-parallel longitudinal magnetic field biasing to the dual magnetoresistive (MR) layers. The magnetoresistive (MR) sensing head so formed provides increased output amplitude and improved signal to noise ratio. Finally, there is disclosed by Lin et al. in U.S. Pat. No. 5,380,548 a method for fabricating a magnetoresistive (MR) sensor with a nickel-manganese anti-ferromagnetic exchange biasing layer. The nickel-manganese anti-ferromagnetic exchange biasing layer provides the magnetoresistive (MR) sensor with improved exchange bias coupling characteristics and improved thermal stability.

The teachings of all of the patterns and printed publications disclosed within this Description of the Related Art are incorporated herein fully by reference.

Desirable in the art are methods and test structures through which exchange fields within patterned exchange biased magnetoresistive (MR) sensor elements may be accurately determined. Particularly desirable are methods and test structures through which exchange fields within patterned exchange biased magnetoresistive (MR) sensor elements may be accurately determined independent of the geometry of the patterned exchange biased magnetoresistive (MR) sensor element through a method which employs a resistance (R) versus magnetic field (H) measurement of the test structure.

SUMMARY OF THE INVENTION

A first object of the present invention is to provide a method and test structure through which a longitudinal magnetic exchange field within a patterned exchange biased magnetoresistive (MR) sensor element may be accurately determined.

A second object of the present invention is to provide a method and test structure in accord with the first object of the present invention, where the longitudinal magnetic exchange field is determined independent of the geometry of the patterned exchange biased magnetoresistive (MR) sensor element.

A third object of the present invention is to provide a method and test structure in accord with the first object of the present invention and the second object of the present invention where the longitudinal magnetic exchange field is determined through analysis of a resistance (R,) versus magnetic field (H) measurement of the test structure.

A fourth object of the present invention is to provide a method and test structure in accord with the first object of the present invention, the second object of the present invention and the third object of the present invention, which method and test structure are readily manufacturable.

In accord with the objects of the present invention, there is provided by the present invention a method and test structure for accurately determining a longitudinal magnetic exchange field within a patterned exchange biased magnetoresistive (MR) sensor element. To practice the method of the present invention, there is first provided a substrate. Formed upon the substrate is a patterned magnetoresistive (MR) layer which has a projected length upon the substrate and a projected width upon the substrate. There is formed at a pair of separated locations over the patterned magnetoresistive (MR) layer a pair of patterned conductor lead layers. The pair of patterned conductor lead layers defines a track width of the patterned magnetoresistive (MR) layer, where the track width of the patterned magnetoresistive (MR) layer is smaller than the projected width of the patterned magnetoresistive (MR) layer. There is also formed upon the patterned magnetoresistive (MR) layer within the track width a minimum of one patterned anti-ferromagnetic layer separated from each patterned conductor lead layer within the pair of patterned conductor lead layers by a minimum of one unpinned width of the patterned magnetoresistive (MR) layer. The patterned magnetoresistive (MR) layer also has a minimum of one pinned width of the patterned magnetoresistive (MR) layer beneath the minimum of one patterned anti-ferromagnetic layer. The projected length of the patterned magnetoresistive (MR) layer, the unpinned width of the patterned magnetoresistive (MR) layer and the pinned width of the patterned magnetoresistive (MR) layer are chosen such that the magnetic domains within the unpinned width of the patterned magnetoresistive (MR) layer and the pinned width of the patterned magnetoresistive (MR) layer are coupled and switch jointly in an externally applied magnetic field. Finally, there is measured through the patterned conductor lead layers a resistance change within the patterned magnetoresistive (MR) layer when the patterned magnetoresistive (MR) layer is exposed to the externally applied magnetic field. The invention also contemplates the test structure through which the method of the invention is practiced.

The present invention provides a method and test structure through which there may be accurately determined a longitudinal magnetic exchange field within a patterned exchange biased magnetoresistive (MR) sensor element, where the longitudinal magnetic exchange field is determined independent of the geometry of the patterned exchange biased magnetoresistive (MR) sensor element. By employing a test structure which is preferably formed simultaneously with and through methods and materials equivalent to the methods and materials employed in forming a magnetoresistive (MR) sensor element upon the same substrate as is formed the test structure of the present invention, there may be determined the longitudinal magnetic exchange field of the patterned exchange biased magnetoresistive (MR) sensor element independent of the geometry of the patterned exchange biased magnetoresistive (MR) sensor element. By choosing the projected length of the patterned magnetoresistive (MR) layer, the unpinned width of the patterned magnetoresistive (MR) layer and the pinned width of the patterned magnetoresistive (MR) layer such that the magnetic domains within the unpinned width of the patterned magnetoresistive (MR) layer and the pinned width of the patterned magnetoresistive (MR) layer are coupled and switch jointly in an externally applied magnetic field, the longitudinal magnetic exchange field may be accurately determined for a patterned exchange biased magnetoresistive (MR) sensor element which is formed simultaneously with and through the same methods and materials as are employed in forming the test structure.

The present invention provides a method and test structure through which a longitudinal magnetic exchange field within a patterned exchange biased magnetoresistive (MR) sensor element may be determined through analysis of a resistance (R) versus magnetic field (H) measurement. In addition to providing for accurate determination of the longitudinal magnetic exchange field, by choosing the projected length of the patterned magnetoresistive (MR) layer, the unpinned width of the patterned magnetoresistive (MR) layer and the pinned width of the patterned magnetoresistive (MR) layer such that the magnetic domains within the unpinned width of the patterned magnetoresistive (MR) layer and the pinned width of the patterned magnetoresistive (MR) layer are coupled and switch jointly in an externally applied magnetic field, the longitudinal magnetic exchange field may also be determined through analysis of a resistance (R) versus magnetic field (H) measurement of the test structure.

The method and test structure of the present invention are readily manufacturable. Through the method of the present invention, there is preferably employed in forming the test structure of the present invention methods, materials and dimensions analogous or equivalent to the methods, materials and dimensions which are employed in simultaneously forming a patterned exchange biased magnetoresistive (MR) sensor element whose longitudinal magnetic exchange field is desired to be determined. The patterned exchanged biased magnetoresistive (MR) sensor element is preferably formed upon the same substrate simultaneously with the test structure. In addition, the test structure differs with respect to the patterned exchange biased magnetoresistive (MR) sensor element primarily with respect to the presence and/or dimensions of the length of the patterned magnetoresistive (MR) layer, the pinned width of the patterned magnetoresistive (MR) layer and the unpinned width of the patterned magnetoresistive (MR) layer. Since the differences between the test structure and the patterned exchange biased magnetoresistive (MR) sensor element may be accommodated within the masks which are employed in forming simultaneously the test structure and the patterned exchange biased magnetoresistive (MR) sensor element, the method and test structure of the present invention are readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 shows a schematic perspective-view diagram of a patterned exchange biased magnetoresistive (MR) sensor element formed through a method conventional in the art.

FIG. 2 shows a schematic cross-sectional diagram illustrating the preferred embodiment of the test structure of the present invention which is employed in measuring longitudinal magnetic exchange fields within patterned exchange biased magnetoresistive (MR) sensor elements.

DESCRIPTION OF THE PREFERRED EMBODIMENTS

Figure 3:
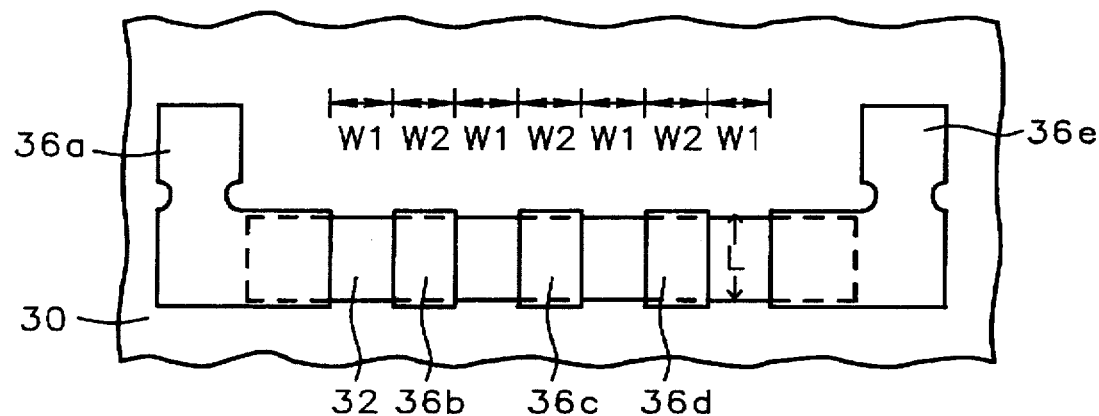
FIG. 3 shows a schematic plan-view diagram illustrating the preferred embodiment of the test structure of the present invention which is employed in measuring longitudinal magnetic exchange fields within patterned exchange biased magnetoresistive (MR) sensor elements.

The present invention provides a method and test structure for determining the longitudinal magnetic exchange field within a patterned exchange biased magnetoresistive (MR) sensor element. To practice the method of the present invention, there is formed within the track width of a patterned magnetoresistive (MR) layer formed upon a substrate a minimum of one patterned anti-ferromagnetic layer which forms a pinned width of the patterned magnetoresistive (MR) layer beneath the patterned anti-ferromagnetic layer. The track width of the patterned magnetoresistive (MR) layer is defined by a pair of patterned conductor lead layers formed over the patterned magnetoresistive (MR) layer. Additionally, the patterned magnetoresistive (MR) layer has a projected length upon the substrate. The patterned antiferromagnetic layer is separated from each patterned conductor lead layer within the pair of patterned conductor lead layers by a minimum of one unpinned width of the patterned magnetoresistive (MR) layer. By choosing the projected length, the unpinned width and the pinned width of the patterned magnetoresistive (MR) layer such that the magnetic domains within the unpinned width and the pinned width of the patterned magnetoresistive (MR) layer are coupled and switch jointly in an externally applied magnetic field, there may be determined the exchange field when the resistance of the patterned magnetoresistive (MR) layer is measured in the presence of the externally applied magnetic field.

Referring now to FIG. 2, there is shown a schematic cross-sectional diagram illustrating the preferred embodiment of the test structure of the present invention. Shown in FIG. 2 is a substrate 30 upon which is formed a patterned magnetoresistive (MR) layer 32. Substrates upon which, in general, may be formed magnetoresistive (MR) sensor elements and upon which may be formed the preferred embodiment of the test structure of the present invention are known in the art. Typically and preferably, the substrate 30 is a non-magnetic inorganic substrate which is either subsequently diced and laminated in forming a slider assembly which is employed within a direct access storage device (DASD) magnetic data storage enclosure or subsequently diced and machined in forming a slider assembly which is employed within a direct access storage device (DASD) magnetic data storage enclosure.

In addition, patterned magnetoresistive (MR) layers which may be employed in forming magnetoresistive (MR) sensor elements are also in general known in the art. Typically and preferably, although not exclusively, such patterned magnetoresistive (MR) layers are formed from a Permalloy (ie: nickel-iron 80:20) magnetoresistive (MR) alloy material formed upon a substrate at a thickness of from about 50 to about 1000 angstroms. The patterned magnetoresistive (MR) layer of Permalloy magnetoresistive (MR) alloy material so formed may be deposited through any of several methods as are known in the art, including but not limited to thermally assisted evaporation methods, electron beam assisted evaporation methods and physical vapor deposition (PVD) sputtering methods. For the preferred embodiment of the method and test structure of the present invention, the patterned magnetoresistive (MR) layer 32 is preferably formed of a Permalloy (ie: nickel-iron 80:20) magnetoresistive (MR) alloy material at a thickness of from about 50 to about 1000 angstroms. In addition to the thickness of from about 50 to about 1000 angstroms, the patterned magnetoresistive (MR) layer 32 of a Permalloy magnetoresistive (MR) alloy material also preferably has a projected width upon the substrate 30 of from about 3 to about 1000 microns and a projected length upon the substrate 30 of from about 1 to about 50 microns.

Also shown in FIG. 2 is a series of patterned anti-ferromagnetic layers 34a, 34b, 34c, 34d and 34e formed upon the patterned magnetoresistive (MR) layer 32. In turn, there is also shown in FIG. 2 formed upon the patterned anti-ferromagnetic layers 34b, 34c and 34d a corresponding series of patterned conductor layers 36b, 36c and 36c, and there is finally shown formed upon the patterned anti-ferromagnetic layers 34a and 34e, while conformally bridging to the substrate 30, a corresponding pair of patterned conductor lead layers 36a and 36e. Methods and materials through which patterned anti-ferromagnetic layers and patterned conductor layers may be formed within magnetoresistive (MR) sensor elements are known in the art. Patterned anti-ferromagnetic layers and the patterned conductor layers may be formed within magnetoresistive (MR) sensor elements through methods including but not limited to thermally assisted evaporation methods, electron beam assisted evaporation methods and physical vapor deposition (PVD) sputtering methods. Patterned anti-ferromagnetic layers within magnetoresistive (MR) sensor elements are typically, although not exclusively, formed of iron-manganese (50:50) anti-ferromagnetic materials. Patterned conductor layers within magnetoresistive (MR) sensor elements are typically, although not exclusively, formed from conductor materials including but not limited to aluminum, gold, copper and/or silver containing conductor materials, as are commonly known in the art. For the preferred embodiment of the method and test structure of the present invention, the patterned anti-ferromagnetic layers 36a, 36b, 36c, 36d and 36e are preferably formed of an iron-manganese (50:50) anti-ferromagnetic material, as is common in the art, formed upon the patterned magnetoresistive (MR) layer 32 to a thickness of from about 100 to about 1000 angstroms. Similarly, for the preferred embodiment of the method and test structure of the present invention, the patterned conductor layers 36a, 36b, 36c, 36d and 36e are preferably formed of an aluminum, gold, copper or silver containing conductor material formed upon the substrate 30 and/or the patterned anti-ferromagnetic layers 34a, 34b, 34c, 34d and 34e to a thickness of from about 100 to about 1000 angstroms.

Finally, there is shown in FIG. 2 the widths W1 and the widths W2, where the widths W1 define the unpinned widths of the patterned magnetoresistive (MR) layer 32 which have neither any patterned anti-ferromagnetic layers formed thereupon nor any patterned conductor layers formed thereover. Similarly, within FIG. 2, the widths W2 define the pinned widths of the patterned magnetoresistive (MR) layer 32 which have both the patterned anti-ferromagnetic layers 34b, 34c and 34d formed thereupon and the corresponding patterned conductor layers 36b, 36c and 36d formed thereover.

Although the test structure whose schematic cross-sectional diagram is illustrated in FIG. 2 shows a test structure employing four unpinned widths W1 and three pinned widths W2, a greater or lesser number of unpinned widths W1 and pinned widths W2 may be employed within the method and test structure of the present invention. In all instances of the test structure of the present invention, the number of unpinned widths W1 will equal the number of pinned widths plus one. For the preferred embodiment of the method and test structure of the present invention, the number of unpinned widths W1 will preferably be from about 2 to about 100 in order to optimize the method and test structure of the present invention. In addition, although it is feasible to employ the method and test structure of the present invention when the widths of the unpinned widths W1 and the pinned widths W2 are varied, it is preferred within the preferred embodiment of the method and test structure of the present invention that the widths of the unpinned widths W1 and the widths of the pinned widths W2 are equal. Finally, for optimal operation of the method and test structure of the present invention, it is preferred that the magnetic domains within the unpinned widths W1 of the patterned magnetoresistive (MR) layer 32 and the magnetic domains within the pinned widths W2 of the patterned magnetoresistive (MR) layer 32 be coupled such that they switch jointly in an externally applied magnetic field. Although there is no practical method to readily predetermine the extent of coupling, the preferred embodiment of the method and test structure of the present invention provide an operational method and structure when the unpinned widths W1 are equivalent to the pinned widths W2 and both the unpinned widths W1 and the pinned width W2 are in the range of from about 0.5 to about 25 microns.

Referring now to FIG. 3, there is shown a schematic plan-view diagram of a test structure corresponding with the schematic cross-sectional diagram of the test structure illustrated in FIG. 2. Shown in FIG. 3 are several of the structures and dimensions which correspond with the structures and dimensions illustrated in FIG. 2. In addition, there is shown in FIG. 3 the dimension L which represents the projected length of the patterned magnetoresistive (MR) layer 32. It is through choosing the projected length L of the patterned magnetoresistive (MR) layer 32 in conjunction with the unpinned widths W1 of the patterned magnetoresistive (MR) layer 32 and the pinned widths W2 of the patterned magnetoresistive (MR) layer 32 that the magnetic domains within the unpinned widths W1 of the patterned magnetoresistive (MR) layer 32 and the pinned widths W2 of the patterned magnetoresistive (MR) layer 32 may be made to couple such that the unpinned widths W1 of the patterned magnetoresistive (MR) layer 32 and the pinned widths W2 of the patterned magnetoresistive (MR) layer 32 switch jointly in an externally applied magnetic field. Thus, for the preferred embodiment of the method and test structure of the present invention, it has been found experimentally that: (1) the unpinned widths W1 and the pinned widths W2 are preferably equal and preferably in the range of from about 5 to about 25 microns; and (2) the ratio of the projected length L to the unpinned widths W1 is preferably greater than about 1.5:1, for measurement of a longitudinal magnetic exchange field of up to about 40 oersteds. Similarly, for the preferred embodiment of the method and test structure of the present invention, it has been found experimentally that: (1) the unpinned widths W1 and the pinned widths W2 are preferably equal and preferably in the range of from about 0.5 to about 5 microns; and (2) the ratio of the projected length L to the unpinned widths W1 is preferably greater than about 1.5:1, for measurement of a longitudinal magnetic exchange field of between about 40 to about 80 oersteds.

In a more general sense, to provide an operative method and test structure of the present invention the unpinned widths W1 of the patterned magnetoresistive (MR) layer 32 are preferably no greater than about 25 microns in width, the pinned widths of the patterned magnetoresistive (MR) layer 32 are preferably no less than about 0.5 microns in width and the ratio of the projected length L of the patterned magnetoresistive (MR) layer 32 to the unpinned widths W1 of the patterned magnetoresistive (MR) layer 32 is preferably at least about 1.5:1.

Figure 4:
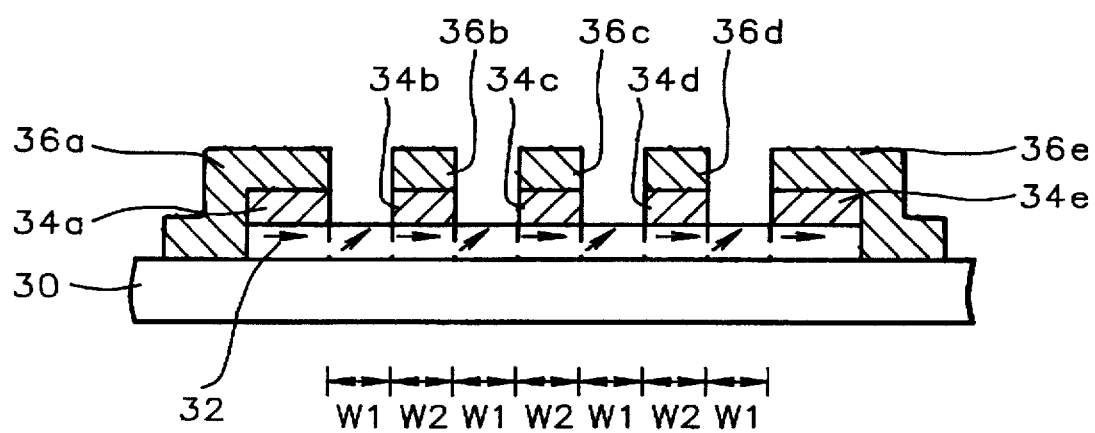
FIG. 4 to FIG. 6 show a series of schematic cross-sectional diagrams illustrating the magnetic domain orientations within the preferred embodiment of the test structure of the present invention which is employed in measuring longitudinal magnetic exchange fields within patterned exchange biased magnetoresistive (MR) sensor elements.
Figure 5:
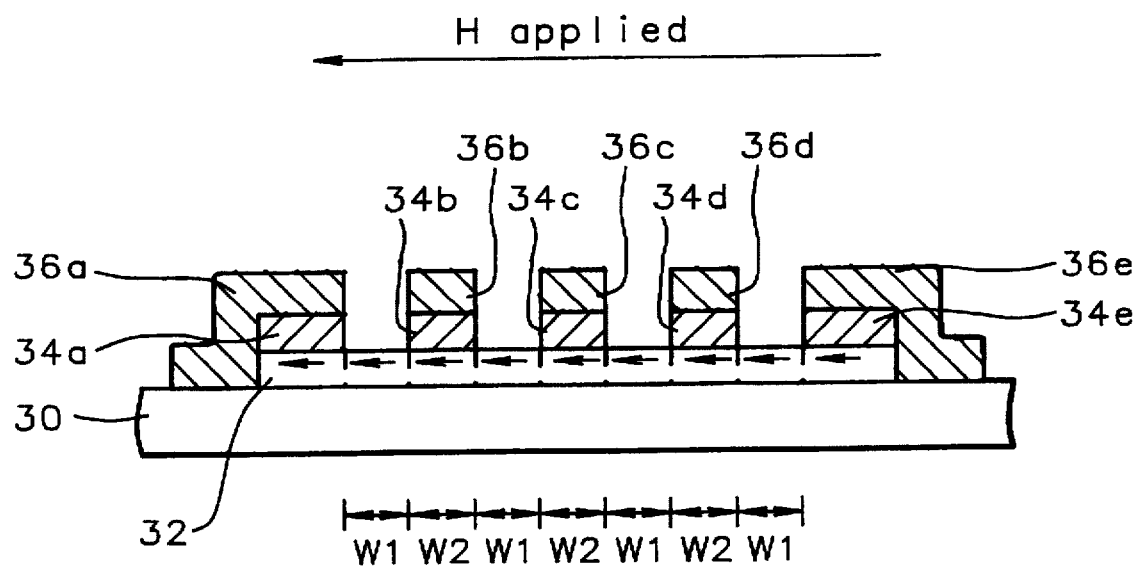
Figure 6:
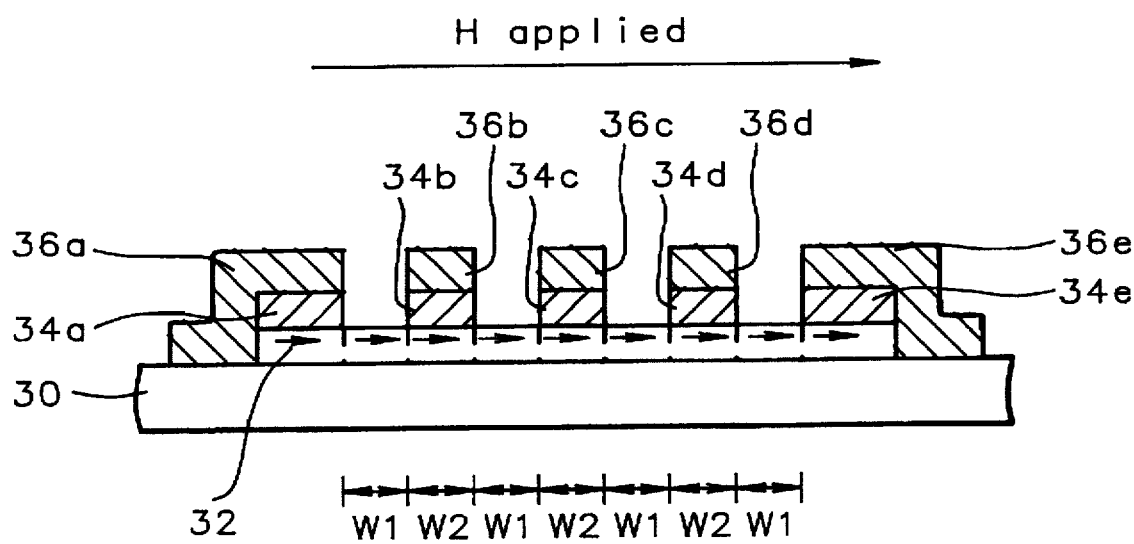

Referring now to FIG. 4 to FIG. 6, there is shown a series of schematic cross-sectional diagrams otherwise equivalent to the schematic cross-sectional diagram of the preferred embodiment of the test structure of the present invention, as illustrated in FIG. 2, and wherein them is shown the orientations of the magnetic domains within the unpinned widths W1 and the pinned widths W2 of the patterned magnetoresistive (MR) layer 32 in the presence and absence of an externally applied magnetic field. Shown in FIG. 4 is a schematic cross-sectional diagram illustrating the preferred embodiment of the test structure of the present invention absent an externally applied magnetic field.

As is shown in FIG. 4, the magnetic domains within the pinned widths W2 are strongly longitudinally aligned due to exchange coupling with the patterned anti-ferromagnetic layers 34b, 34c and 34d. In contrast, the magnetic domains within the unpinned widths W1 are less strongly aligned but nonetheless ordered by the presence of the anti-ferromagnetic layers 34a, 34b, 34c, 34d and 34e. As is illustrated in FIG. 5, when a magnetic field is externally applied counter-opposed to the original orientation of the magnetic domains within the unpinned widths W1 and the pinned widths W2, the magnetic domains within the unpinned widths W1 and the pinned widths W2 will switch jointly due to the coupling between the unpinned widths W1 and the pinned widths W2 within the patterned magnetoresistive (MR) layer 32. Similarly, as is shown in FIG. 6, when a magnetic field gradient is externally applied counter-opposed to the magnetic field gradient which is externally applied within FIG. 5, the magnetic domains within the unpinned widths W1 and the magnetic domains within the pinned widths W2 will again switch jointly due to the coupling between the unpinned widths W1 and the pinned widths W2 within the patterned magnetoresistive (MR) layer 32. In the absence of the coupling of the unpinned widths W1 and the pinned widths W2, there is measured through the method and test structure of the present invention the magnetic field at which the magnetic domains within the unpinned widths W1 switch since the patterned conductor layers 36b, 36c and 36d serve to shunt current which would otherwise pass at least in part through pinned widths W2 of the patterned magnetoresistive (MR) layer 32.

As is understood by a person skilled in the art, it is also theoretically possible to provide a method and test structure in accord with the present invention, where the test structure is otherwise equivalent to the test structure whose schematic cross-sectional diagram is illustrated in FIG. 4 to FIG. 6, but from which test structure is absent the patterned conductor layers 36b, 36c and 36d. Due to the absence of the patterned conductor layers 36b, 36c and 36d, such a test structure would provide a substantial reduction in current shunted away from the pinned widths W2 of the patterned magnetoresistive (MR) layer 32 under circumstances where the patterned anti-ferromagnetic layers 34b, 34c and 34d have a resistance within or greater than the range of resistance of the pinned widths W2 of the patterned magnetoresistive (MR) layer 32. While such a test structure may be theoretically desirable, such a test structure presents a practical problem in its fabrication since it would require additional masking and etching processing steps which are typically neither required nor desired within the fabrication of a magnetoresistive (MR) sensor element upon the same substrate upon which is formed the test structure whose schematic cross-sectional diagram is illustrated in FIG. 4 to FIG. 6.

Upon providing a test structure analogous to the test structure whose schematic cross-sectional diagram is illustrated in FIG. 4 to FIG. 6, and where the test structure is formed with a projected length L, unpinned widths W1 and pinned widths W2 in accord with the general embodiment or preferred embodiments of the method and test structure of the present invention, there is provided a method and test structure through which there may be accurately determined the longitudinal magnetic exchange field within a patterned exchange biased magnetoresistive (MR) sensor element fabricated simultaneously with and upon the same substrate as the test structure. The longitudinal magnetic exchange field may be determined through a resistance (R) versus magnetic field (H) measurement rather than a magnetic flux (B) versus magnetic field (H) measurement.

EXAMPLES

Each of three non-magnetic and non-conducting substrates had formed upon its surface a test structure in accord with the test structure whose schematic cross-sectional diagram is illustrated in FIG. 2 and whose schematic plan-view diagram is illustrated in FIG. 3. The test structures comprised patterned magnetoresistive (MR) layers of thickness about 250 angstroms and projected width about 300 microns formed from a Permalloy (ie: nickel-iron 80:20) magnetoresistive (MR) alloy material deposited through a physical vapor deposition (PVD) sputtering method. Upon the three patterned magnetoresistive (MR) layers were then formed three series of patterned anti-ferromagnetic layers, and upon the three series of patterned anti-ferromagnetic layers were formed three corresponding series of patterned conductor layers, including a pair of patterned conductor lead layers, for each test structure within the series of three test structures. The patterned anti-ferromagnetic layers were formed of an iron-manganese 50:50 anti-ferromagnetic material formed to a thickness of about 250 angstroms, and the patterned conductor layers were formed of a gold containing conductor material at a thickness of about 500 angstroms. The patterned conductor layers and the patterned anti-ferromagnetic layers were formed through successive photolithographic and etch patterning methods as are known in the art.

The three test structures formed upon the three non-magnetic and non-conducting substrates were fabricated to three different sets of geometric parameters with respect to the projected length L of the patterned magnetoresistive (MR) layers, the unpinned widths W1 of the patterned magnetoresistive (MR) layers and the pinned widths W2 of the patterned magnetoresistive (MR) layers. The values for L, W1 and W2 employed in forming each test structure within the series of three test structures are summarized in Table I. The number of patterned anti-ferromagnetic layers employed within each of the three test structures varied from 18 to 40, in order to provide within the variation of unpinned widths W1 and pinned widths W2 patterned magnetoresistive layers whose projected widths were substantially completely occupied by unpinned widths W1 and pinned widths W2. The three non-magnetic and non-conducting substrates upon which the three test structures were formed were then exposed to: (1) an externally applied negative magnetic field progressing from 0 oersteds to about −100 oersteds at a rate of about 200 oersteds per second; followed by (2) an externally applied positive magnetic field progressing from about −100 oersteds to about +100 oersteds at a rate of about 200 oersteds per second. Through the externally applied negative magnetic field and the externally applied positive magnetic field there was obtained through methods as are conventional in the art resistance (R) versus magnetic field (H) measurements for each of the three test structures. Plots of the resistance (R) versus magnetic field (H) measurements for the three test structures are shown in FIG. 7 to FIG. 9 and cross-referenced within Table I.

TABLE I

Figure 7:
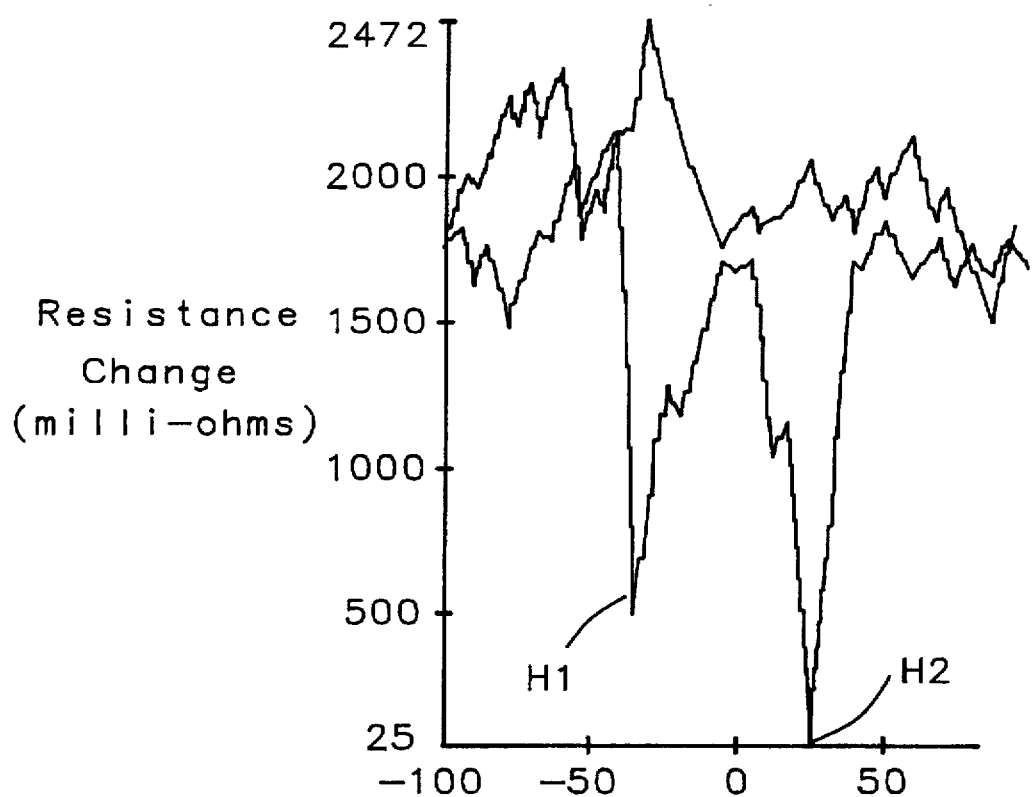
FIG. 7 to FIG. 9 show a series of three plots of resistance change (R) versus magnetic field (H) measurements for three separate examples of a test structure, where two of the three examples are formed in accord with the preferred embodiment of the test structure of the present invention which is employed in determining a longitudinal magnetic exchange field in accord with the preferred embodiment of the method of the present invention.
Figure 8:
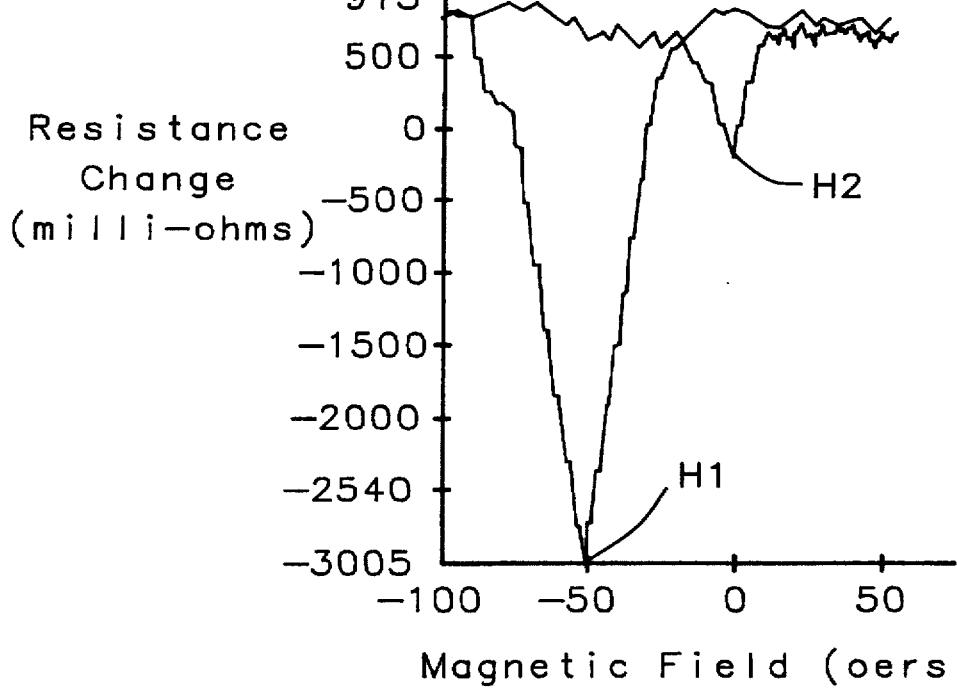
Figure 9:
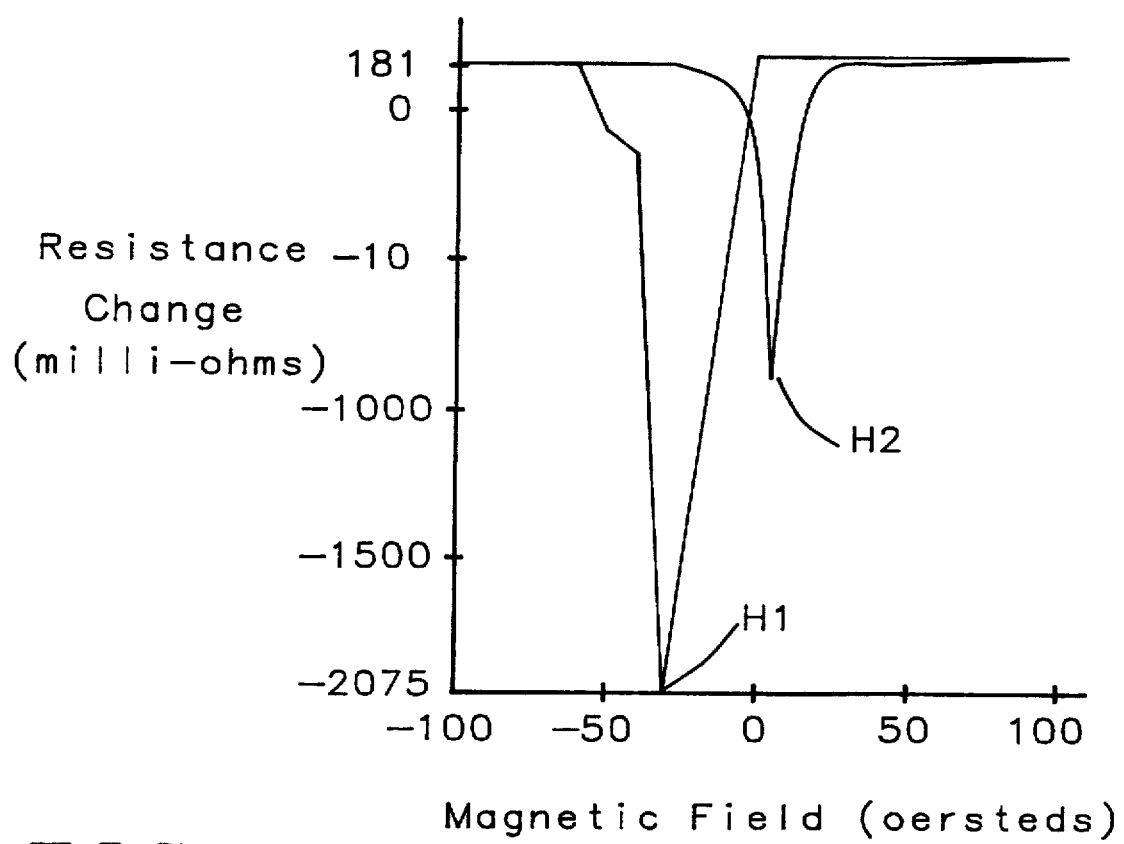

| Example | MR Length L | Unpinned Width W1 | Pinned Width W2 | L/W1 | Cross-Ref. |
|---|---|---|---|---|---|
| 1 | 5.0 microns | 5.0 microns | 5.0 microns | 1.0 | FIG. 7 |
| 2 | 5.0 | 2.7 | 7.3 | 1.9 | FIG. 8 |
| 3 | 10.0 | 5.0 | 5.0 | 2.0 | FIG. 9 |

From review of the data within Table I, along with the plotted resistance (R) versus magnetic field (H) measurements of FIG. 7 to FIG. 9, it is seen that at the higher ratios of projected length L of the patterned magnetoresistive (MR) layers with respect to the unpinned widths W1 of the patterned magnetoresistive (MR) layers there is obtained as illustrated in FIG. 8 and FIG. 9 resistance (R) versus magnetic field (H) plots which are substantially free of noise and substantially free of splitting of the major peaks at which magnetic domain switching transitions (as evidenced by resistance changes) occur. In comparison, it is seen from FIG. 7 that at a lower ratio of projected length L of the patterned magnetoresistive (MR) layer with respect to the unpinned widths W1 of the patterned magnetoresistive (MR) layer there is obtained a resistance (R) versus magnetic field (H) plot which illustrates substantial additional noise and peak splitting which is indicative of incompletely coupled magnetic domains within the unpinned widths W1 and the pinned widths W2 of the patterned magnetoresistive (MR) layer.

From a resistance (R) versus magnetic field (H) plot such as the resistance (R) versus magnetic field (H) plot shown in FIG. 7 it becomes increasingly difficult to obtain an accurate value of a longitudinal magnetic exchange field. In comparison, from the resistance (R) versus magnetic field (H) plots of FIG. 8 and FIG. 9 an accurate value of a longitudinal magnetic exchange field is more accurately and readily determined from the positions of the peaks H1 and the peaks H2. Within FIG. 7 to FIG. 9, the peaks H1 correspond with the magnetic field at which magnetic domains within the unpinned widths W1 and the pinned widths W2 of the patterned magnetoresistive (MR) layers switched when exposed to the externally applied negative magnetic field. Similarly, the peaks H2 correspond with the magnetic field at which magnetic domains within the unpinned widths W1 and the pinned widths W2 of the patterned magnetoresistive (MR) layers switched when exposed to the externally applied positive magnetic field which followed the externally applied negative magnetic field.

As is understood by a person skilled in the art, the preferred embodiments and examples of the method and test structure of the present invention are illustrative of the method and test structure of the present invention rather than limiting of the method and test structure of the present invention. Revisions may be made to methods, materials, structures and dimensions through which is provided the preferred embodiments and examples of the method and test structure of the present invention while still providing a method and test structure in accord with the spirit and scope of the present invention, as defined by the accompanying claims.

What is claimed is:

1. A method for determining a magnetic domain switching field comprising:

providing a substrate;

forming upon the substrate a patterned magnetoresistive (MR) layer, the patterned magnetoresistive (MR) layer having a projected length of the patterned magnetoresistive (MR) layer upon the substrate and a projected width of the patterned magnetoresistive (MR) layer upon the substrate;

forming at a pair of separated locations over the patterned magnetoresistive (MR) layer a pair of patterned conductor lead layers, the pair of patterned conductor lead layers defining a track width of the patterned magnetoresistive (MR) layer, the track width of the patterned magnetoresistive (MR) layer being smaller than the projected width of the patterned magnetoresistive (MR) layer;

forming upon the track width of the patterned magnetoresistive (MR) layer a minimum of one patterned anti-ferromagnetic layer separated from each patterned conductor lead layer within the pair of patterned conductor lead layers by a minimum of one unpinned width of the patterned magnetoresistive (MR) layer, the patterned magnetoresistive (MR) layer also having a minimum of one pinned width of the patterned magnetoresistive (MR) layer beneath the minimum of one patterned anti-ferromagnetic layer, where the pinned width of the patterned magnetoresistive (MR) layer and the unpinned width of the patterned magnetoresistive (MR) layer each have their magnetic domains ordered in a first direction absent an external magnetic field, and where the projected length of the patterned magnetoresistive (MR) layer, the unpinned width of the patterned magnetoresistive (MR) layer and the pinned width of the patterned magnetoresistive (MR) layer are chosen such that the magnetic domains within the unpinned width of the patterned magnetoresistive (MR) layer and the pinned width of the patterned magnetoresistive (MR) layer are coupled such that they switch jointly in an externally applied magnetic field gradient;

exposing the substrate to an externally applied negative magnetic field gradient opposite the first direction of the magnetic domains within the pinned width of the patterned magnetoresistive (MR) layer and the unpinned width of the patterned magnetoresistive (MR) layer while measuring a first resistance change through the pair of patterned conductor lead layers to determine a first magnetic field strength at which the magnetic domains within the pinned width of the patterned magnetoresistive (MR) layer and the unpinned width of the patterned magnetoresistive (MR) layer switch jointly to a second direction opposite the first direction; and exposing the substrate to a positive magnetic field gradient opposite the second direction of the magnetic domains within the pinned width of the patterned magnetoresistive (MR) layer and the unpinned width of the patterned magnetoresistive (MR) layer while measuring a second resistance change through the pair of patterned conductor lead layers to determine a second magnetic field strength at which the magnetic domains within the pinned width of the patterned magnetoresistive (MR) layer and the unpinned width of the patterned magnetoresistive (MR) layer switch jointly to return to the first direction opposite the second direction.

2. The method of claim 1 wherein the patterned magnetoresistive (MR) layer is formed from a Permalloy (nickel-iron 80:20) magnetoresistive (MR) alloy material formed upon the substrate to a thickness of from about 50 to about 1000 angstroms.

3. The method of claim 1 wherein the projected length of the patterned magnetoresistive (MR) layer is from about 1 to about 50 microns and the projected width of the patterned magnetoresistive (MR) layer is from about 3 to about 1000 microns.

4. The method of claim 1 wherein the unpinned width of the patterned magnetoresistive (MR) layer is equal to the pinned width of the patterned magnetoresistive (MR) layer, the unpinned width of the patterned magnetoresistive (MR) layer and the pinned width of the patterned magnetoresistive (MR) layer having a width of from about 0.5 to about 25 microns.

5. The method of claim 4 wherein the unpinned width of the patterned magnetoresistive (MR) layer is from about 5 to about 25 microns and the ratio of the projected length of the patterned magnetoresistive (MR) layer to the unpinned width of the patterned magnetoresistive (MR) layer is greater than about 1.5:1 for measurement of a longitudinal magnetic exchange field of up to about 40 oersteds.

6. The method of claim 4 wherein the unpinned width of the patterned magnetoresistive (MR) layer is from about 0.5 to about 5 microns and the ratio of the projected length of the patterned magnetoresistive (MR) layer to the unpinned width of the patterned magnetoresistive (MR) layer is greater than about 1.5:1 for measurement of a longitudinal magnetic exchange field of from about 40 to about 80 oersteds.

7. The method of claim 1 wherein the patterned magnetoresistive (MR) layer has from about 2 to about 100 patterned anti-ferromagnetic layers formed within the track width of the patterned magnetoresistive (MR) layer.

8. The method of claim 7 wherein the patterned anti-ferromagnetic layers are formed from an iron-manganese 50:50 anti-ferromagnetic material at a thickness of from about 100 to about 1000 angstroms each.

9. The method of claim 1 further comprising forming a patterned conductor layer upon the patterned anti-ferromagnetic layer, the patterned conductor layer being formed simultaneously with and from the same material as the pair of patterned conductor lead layers.

10. The method of claim 1 wherein the patterned magnetoresistive (MR) layer, the pair of patterned conductor lead layers, and the patterned anti-ferromagnetic layer are formed simultaneously with and through methods and materials equivalent to the methods and materials employed in forming a magnetoresistive (MR) sensor element upon the substrate.

11. A test structure for determining a magnetic domain switching field comprising:

a substrate;

a patterned magnetoresistive (MR) layer formed upon the substrate, the patterned magnetoresistive (MR) layer having a projected length of the patterned magnetoresistive (MR) layer upon the substrate and a projected width of the patterned magnetoresistive (MR) layer upon the substrate;

a pair of patterned conductor lead layers formed at a pair of separated locations over the patterned magnetoresistive (MR) layer, the pair of patterned conductor lead layers being separated by a track width of the patterned magnetoresistive (MR) layer, the track width of the patterned magnetoresistive (MR) layer being smaller than the projected width of the patterned magnetoresistive (MR) layer;

a minimum of one patterned anti-ferromagnetic layer formed upon the track width of the patterned magnetoresistive (MR) layer, the patterned anti-ferromagnetic layer being separated from each patterned conductor lead layer within the pair of patterned conductor lead layers by a minimum of one unpinned width of the patterned magnetoresistive (MR) layer, the patterned magnetoresistive (MR) layer also having a minimum of one pinned width of the patterned magnetoresistive (MR) layer beneath the minimum of one patterned anti-ferromagnetic layer, where the magnetic domains within the the pinned width of the patterned magnetoresistive (MR) layer and the unpinned width of the patterned magnetoresistive (MR) layer are ordered in a first direction in absence of an applied magnetic field, and where the projected length of the patterned magnetoresistive (MR) layer, the unpinned width of the patterned magnetoresistive (MR) layer and the pinned width of the patterned magnetoresistive (MR) layer are chosen such that the magnetic domains within the unpinned width of the patterned magnetoresistive (MR) layer and the pinned width of the patterned magnetoresistive (MR) layer are coupled such that they switch jointly in an externally applied magnetic field gradient.

12. The test structure of claim 11 wherein the patterned magnetoresistive (MR) layer is formed from a Permalloy (ie: nickel-iron 80:20) magnetoresistive (MR) alloy material formed upon the substrate to a thickness of from about 50 to about 1000 angstroms.

13. The test structure of claim 11 wherein the projected length of the patterned magnetoresistive (MR) layer is from about 1 to about 50 microns and the projected width of the patterned magnetoresistive (MR) layer is from about 3 to about 1000 microns.

14. The test structure of claim 11 wherein the unpinned width of the patterned magnetoresistive (MR) layer is equal to the pinned width of the patterned magnetoresistive (MR) layer, the unpinned width of the patterned magnetoresistive (MR) layer and the pinned width of the patterned magnetoresistive (MR) layer having a width of from about 0.5 to about 25 microns.

15. The test structure of claim 14 wherein the unpinned width of the patterned magnetoresistive (MR) layer is from about 5 to about 25 microns and the ratio of the projected length of the patterned magnetoresistive (MR) layer to the unpinned width of the patterned magnetoresistive (MR) layer is greater than about 1.5:1 for measurement of a longitudinal magnetic exchange field of up to about 40 oersteds.

16. The test structure of claim 14 wherein the unpinned width of the patterned magnetoresistive (MR) layer is from about 0.5 to about 5 microns and the ratio of the projected length of the patterned magnetoresistive (MR) layer to the unpinned width of the patterned magnetoresistive (MR) layer is greater than about 1.5:1 for measurement of a longitudinal magnetic exchange field of from about 40 to about 80 oersteds.

17. The test structure of claim 11 wherein the patterned magnetoresistive (MR) layer has from about 2 to about 100 patterned anti-ferromagnetic layers formed within the track width of the patterned magnetoresistive (MR) layer.

18. The test structure of claim 17 wherein the patterned anti-ferromagnetic layers are formed from an iron-manganese (50:50) anti-ferromagnetic material at a thickness of from about 100 to about 1000 angstroms.

19. The test structure of claim 11 further comprising a patterned conductor layer formed upon the patterned anti-ferromagnetic layer, the patterned conductor layer being formed simultaneously with and from the same material as the pair of patterned conductor lead layers.

20. The test structure of claim 11 wherein the patterned magnetoresistive (MR) layer, the pair of patterned conductor lead layers, and the patterned anti-ferromagnetic layer are formed simultaneously with and through methods and materials equivalent to the methods and materials employed in forming a magnetoresistive (MR) sensor element upon the substrate.

* * * * *